US012358784B2

(12) United States Patent
O'Hara

(10) Patent No.: US 12,358,784 B2
(45) Date of Patent: Jul. 15, 2025

(54) METHOD OF MANUFACTURING A MICROSTRUCTURE

(71) Applicant: MEMSSTAR LIMITED, Lothian (GB)

(72) Inventor: Anthony O'Hara, Lothian (GB)

(73) Assignee: MEMSSTAR LIMITED, Lothian (GB)

( * ) Notice: Subject to any disclaimer, the term of this patent is extended or adjusted under 35 U.S.C. 154(b) by 0 days.

(21) Appl. No.: 17/777,113

(22) PCT Filed: Nov. 12, 2020

(86) PCT No.: PCT/GB2020/052885
§ 371 (c)(1),
(2) Date: May 16, 2022

(87) PCT Pub. No.: WO2021/094762
PCT Pub. Date: May 20, 2021

(65) Prior Publication Data
US 2022/0388837 A1 Dec. 8, 2022

(30) Foreign Application Priority Data

Nov. 14, 2019 (GB) ..................................... 1916586

(51) Int. Cl.
*B81C 1/00* (2006.01)
*B81B 7/02* (2006.01)
*H01L 21/02* (2006.01)

(52) U.S. Cl.
CPC ............ *B81B 7/02* (2013.01); *B81C 1/00015* (2013.01); *B81C 1/00476* (2013.01);
(Continued)

(58) Field of Classification Search
CPC ........ B81C 1/00015; B81C 2201/0132; B81C 1/00928; B81C 1/00936; B81C 1/00944;
(Continued)

(56) References Cited

U.S. PATENT DOCUMENTS 6,740,247 B1 5/2004 Han et al.
6,936,183 B2 8/2005 Chinn et al.
(Continued)

FOREIGN PATENT DOCUMENTS

CN 1484611 A 3/2004
CN 101500935 A 8/2009
(Continued)

OTHER PUBLICATIONS

Machine translation of JP H0422123 A (Year: 1992).*
(Continued)

*Primary Examiner* — Khaja Ahmad
*Assistant Examiner* — Sun Mi Kim King
(74) *Attorney, Agent, or Firm* — Saul Ewing LLP

(57) ABSTRACT

There is provided a method of producing a microstructure that comprises employing a hydrogen fluoride (HF) vapour to etch a sacrificial layer of silicon dioxide ($SiO_2$) and thereafter removing a residual layer formed when HF vapour etching the layer of silicon dioxide. The residual layer may comprise silicon, ammonium salt or carbon and various techniques are disclosed for removing such layers. These techniques may be applied concurrently, or sequentially, to the microstructure. The described methodologies therefore produce microstructures that exhibits reduced levels of residue when as compared to those techniques known in the art.

6 Claims, 4 Drawing Sheets

(52) U.S. Cl.
CPC .. *B81C 1/00936* (2013.01); *B81C 2201/0132* (2013.01); *H01L 21/02049* (2013.01)

(58) Field of Classification Search
CPC ............ B81C 1/00952; B81C 1/00476; B81C 1/00841–00857; H01L 21/02046–02049; H01L 21/02096
See application file for complete search history.

(56) References Cited

U.S. PATENT DOCUMENTS

| | | | |
|---|---|---|---|
| 2002/0058422 A1* | 5/2002 | Jang | B81C 1/00936 257/E21.252 |
| 2004/0094086 A1 | 5/2004 | Shimaoka et al. | |
| 2004/0259370 A1 | 12/2004 | Bergman | |
| 2005/0106318 A1 | 5/2005 | Partridge et al. | |
| 2009/0308843 A1 | 12/2009 | Ohara | |
| 2016/0196984 A1 | 7/2016 | Lill et al. | |

FOREIGN PATENT DOCUMENTS

| | | |
|---|---|---|
| CN | 207664047 U | 7/2018 |
| EP | 2046677 B1 | 10/2011 |
| JP | H0422123 A * | 1/1992 |
| JP | 2010214480 A | 9/2010 |
| WO | 2008/015434 A1 | 2/2008 |

OTHER PUBLICATIONS

Helm, et al., J. Vacuum Science & Technology A, vol. 10, No. 4 "Mechanisms of the HF/H20 vapor phase etching of Si02," pp. 806-811 (1992).
International Search Report, dated Mar. 15, 2021, issued in International Application No. PCT/GB2020/052885.

* cited by examiner

METHOD OF MANUFACTURING A MICROSTRUCTURE

CROSS REFERENCE TO RELATED APPLICATIONS

This application claims the priority of International Application No. PCT/GB2020/052885, filed on Nov. 12, 2020, which claims priority to GB Application No. GB 1916586.9, filed on Nov. 14, 2019, the entire contents of which are fully incorporated herein by reference.

The present invention relates to a method for use in the manufacturing of microstructures. Typically, the microstructures are in the form of micro electromechanical systems (MEMS) that require the removal of a material relative to a substrate or other deposited material. In particular, this invention relates to an improved method for manufacturing a microstructure that employs the step of etching silicon dioxide with a hydrogen fluoride (HF) vapour.

BACKGROUND TO THE INVENTION

Isotropic etching of silicon oxides is widely used in semiconductor and MEMS processing, primarily in wafer cleaning and release processes. In the manufacture of microstructures, for example a microelectro-mechanical structures (MEMS) of the type presented in FIG. 1 and represented generally by reference numeral 1, etching processes are used to remove sacrificial (i.e. unwanted) areas or layers of material 2. MEMS 1 have found applications in inertial measurement, pressure sensing, thermal measurement, micro-fluidics, optics, and radio-frequency communications, and the range of possibilities for these structures continues to grow. Sacrificial layers 2 are initially deposited on a substrate 3 in the construction of the MEMS and then subsequently removed with an etch step, which allows the released structure 4 to operate as designed e.g. as a micromirror, accelerometer or microphone. In order to produce reliable structures, the release etch step is required to remove the sacrificial layer 2 without etching the surrounding material. Ideally the etch of the sacrificial layer 2 should have no impact at all on the remaining structure.

One of the most common materials used as the sacrificial layer 2 is silicon dioxide that is then etched using a hydrogen fluoride (HF) vapour, see for example UK patent number GB 2,487,716 B. An HF vapour etch is a plasma-less chemical etch and is described by the reaction equations:

$$2HF + H_2O \rightarrow HF_2^- H_3O^+ \qquad (1)$$

$$SiO_2 + 2HF_2^- \rightarrow SiF_4 + 4H_2O \qquad (2)$$

The water ($H_2O$) is found to ionises the HF vapour, as described by equation (1), and the ionised HF vapour ($HF_2^-$) then etches the silicon dioxide ($SiO_2$), with the water ($H_2O$) acting as a catalyst. From equation (2), it is clear that water ($H_2O$) is also generated from the etching reaction itself.

As well as being employed in the production of MEMS 1, silicon dioxide layers are also present within semiconductor devices. Therefore, it is also known for hydrogen fluoride (HF) vapour etching techniques to be employed to create air-gap structures in multi-level metal structures used in standard semiconductor devices, see for example U.S. Pat. No. 7,211,496.

It is universally accepted that for HF vapour etching to proceed, with a usable etch rate, say greater than 30 nm/min, a condensed fluid layer 5 is required to be present on the surface to be etched, see for example Journal of Vacuum Science and Technology A, 10 (4) July/August 1992 entitled "Mechanisms of the HF/$H_2O$ vapor phase etching of $SiO_2$" in the name of Helms et al. Of all the compounds associated with the above described HF vapour etching process, water ($H_2O$) has the lowest vapour pressure and therefore forms the basis of the condensed fluid layer 5. European patent number EP2046677 B1 discloses how control of the formation and composition of the condensed fluid layer 5 is key to managing the HF vapour etching of silicon dioxide. Precise etch control is achieved by performing the HF etch in a vacuum chamber, controlling the chamber pressure, temperature and the gas flows into the chamber. Other parameter that influence the HF vapour etch are the composition of the silicon dioxide layer being etched and the method of its deposition.

A chemical vapour deposition (CVD) process is normally employed to deposit silicon dioxide ($SiO_2$) onto a substrate. In these processes, chemical precursors, one a silicon source and the other an oxygen source, react to deposit the silicon dioxide layer 2 onto the substrate 3. The most common of these processes is Plasma Enhanced CVD (PECVD) since this process allows the deposition to be performed at a low temperature, <450° C.

When depositing oxide layers (e.g. silicon dioxide layers 2 via a PECVD process) impurities can be incorporated into the layer, either intentionally or unintentionally. When this is done intentionally it is known as doping the silicon dioxide layer 2. Employing doping layers (e.g. phosphosilicate glass (PSG) and borophosphosilicate glass (BPSG) layers) is also common within semiconductor fabrication processes as the presence of dopant materials provides for better step coverage, thermal properties, electrical improvement and barrier performance. However, since the HF vapour etching process is a chemical etch it often etches the silicon dioxide but not the impurity material contained therein. Therefore, as the doped silicon dioxide is etched the impurity material becomes exposed to the condensed fluid layer 5 that exists during the etching process. As the etch progresses, if the impurity material is not itself etched by the HF vapour, and when exposed is not a volatile material, then the impurity material will gather within the condensed fluid layer 5. Depending on the chemical properties the impurity material it may remain in the condensed fluid layer 5 until the etching process stops and the condensed fluid layer 5 evaporates. At this point the impurity material forms a residue that is highly undesirable feature within the final MEMS or semiconductor microstructure.

SUMMARY OF THE INVENTION

It is therefore an object of an embodiment of the present invention to provide a method of producing a microstructure that employs the step of HF etching a sacrificial layer silicon dioxide that exhibits reduced levels of residual layers or films when as compared to those techniques known in the art.

According to a first aspect of the present invention, there is provided a method of producing a microstructure the method comprising:

employing a hydrogen fluoride (HF) vapour to etch a sacrificial layer of silicon dioxide ($SiO_2$); and
removing a residual layer formed when HF vapour etching the layer of silicon dioxide.

The vapour etching of the sacrificial layer of silicon dioxide ($SiO_2$) and the removal of the residual layer may be performed sequentially or concurrently within a common processing chamber. Alternatively, the vapour etching of the sacrificial layer of silicon dioxide ($SiO_2$) and the removal of the residual layer may be performed sequentially within separate processing chambers.

Optionally, removing the residual layer comprises reacting the residual layer with a first additional gas.

Most preferably removing the residual layer comprises removing a residual layer comprising silicon. Alternatively, removing the residual layer comprises removing a residual layer comprising ammonium salt. In a yet alternative embodiment removing the residual layer comprises removing a residual layer comprising carbon Optionally, removing the residual layer comprises reacting the silicon with a hydrogen gas to produce silane ($SiH_4$).

Alternatively, removing the residual layer may comprise reacting the silicon with an oxygen gas to produce a silicon dioxide ($SiO_2$). Removing the residual layer may then further comprise employing a hydrogen fluoride (HF) vapour to etch the silicon dioxide ($SiO_2$).

In a further alternative, removing the residual layer comprises reacting the silicon with a fluorine gas to produce silicon tetrafluoride ($SiF_4$).

In a further alternative, removing the residual layer may comprise etching the silicon with a Xenon Difluoride ($XeF_2$) vapour.

Removing the residual layer may comprise reacting the carbon with an oxygen gas to produce carbon dioxide ($CO_2$) and or carbon monoxide (CO). Alternatively, removing the residual layer comprises reacting the carbon with a hydrogen gas to produce methane ($CH_4$). Alternatively, removing the residual layer comprises reacting the carbon with a fluorine gas to produce tetrafluoride ($CF_4$) and or Hexafluoroethane ($C_2F_6$).

In a further alternative, removing the residual layer may comprise heating the ammonium salt to a temperature greater than 160° C.

The method of producing a microstructure may further comprises employing a vacuum pumping system to remove by products formed when removing the residual layer.

Most preferably the microstructure comprises a micro electromechanical systems (MEMS). Alternatively, the microstructure comprises a semiconductor device.

According to a second aspect of the present invention, there is provided a method of producing a microstructure the method comprising:
  employing a hydrogen fluoride (HF) vapour to etch a sacrificial layer of silicon dioxide ($SiO_2$); and
  removing a residual layer comprising silicon formed when HF vapour etching the layer of silicon dioxide.

Embodiments of the second aspect of the invention may include one or more features of the first aspect of the invention or its embodiments, or vice versa.

According to a third aspect of the present invention, there is provided a method of producing a microstructure the method comprising:
  employing a hydrogen fluoride (HF) vapour to etch a sacrificial layer of silicon dioxide ($SiO_2$); and
  removing a residual layer comprising ammonium salt formed when HF vapour etching the layer of silicon dioxide.

Embodiments of the third aspect of the invention may include one or more features of the first or second aspects of the invention or its embodiments, or vice versa.

According to a fourth aspect of the present invention, there is provided a method of producing a microstructure the method comprising:
  employing a hydrogen fluoride (HF) vapour to etch a sacrificial layer of silicon dioxide ($SiO_2$); and
  removing a residual layer comprising carbon formed when HF vapour etching the layer of silicon dioxide.

Embodiments of the fourth aspect of the invention may include one or more features of the first, second or third aspects of the invention or its embodiments, or vice versa.

BRIEF DESCRIPTION OF THE DRAWINGS

There will now be described, by way of example only, various embodiments of the invention with reference to the drawings, of which.

DETAILED DESCRIPTION OF PREFERRED EMBODIMENTS

Figure 1:
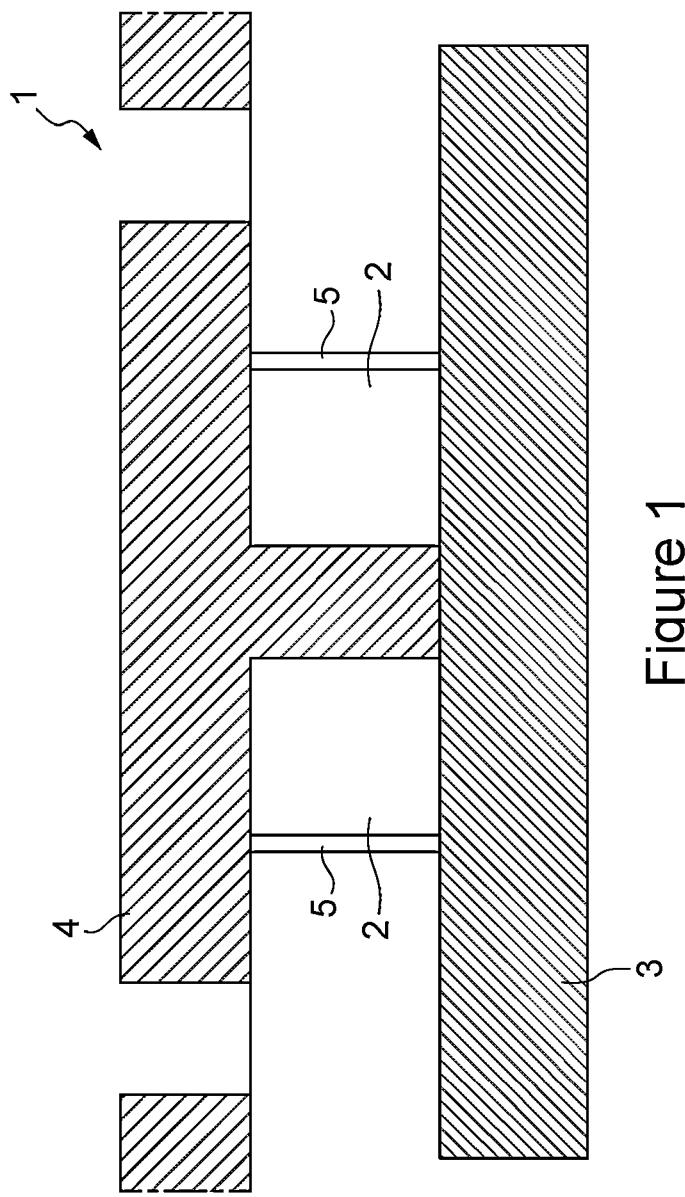
FIG. 1 presents a schematic representation of an HF vapour etch of a MEMS that comprises a silicon dioxide layer located between a substrate and a release layer.
Figure 2:
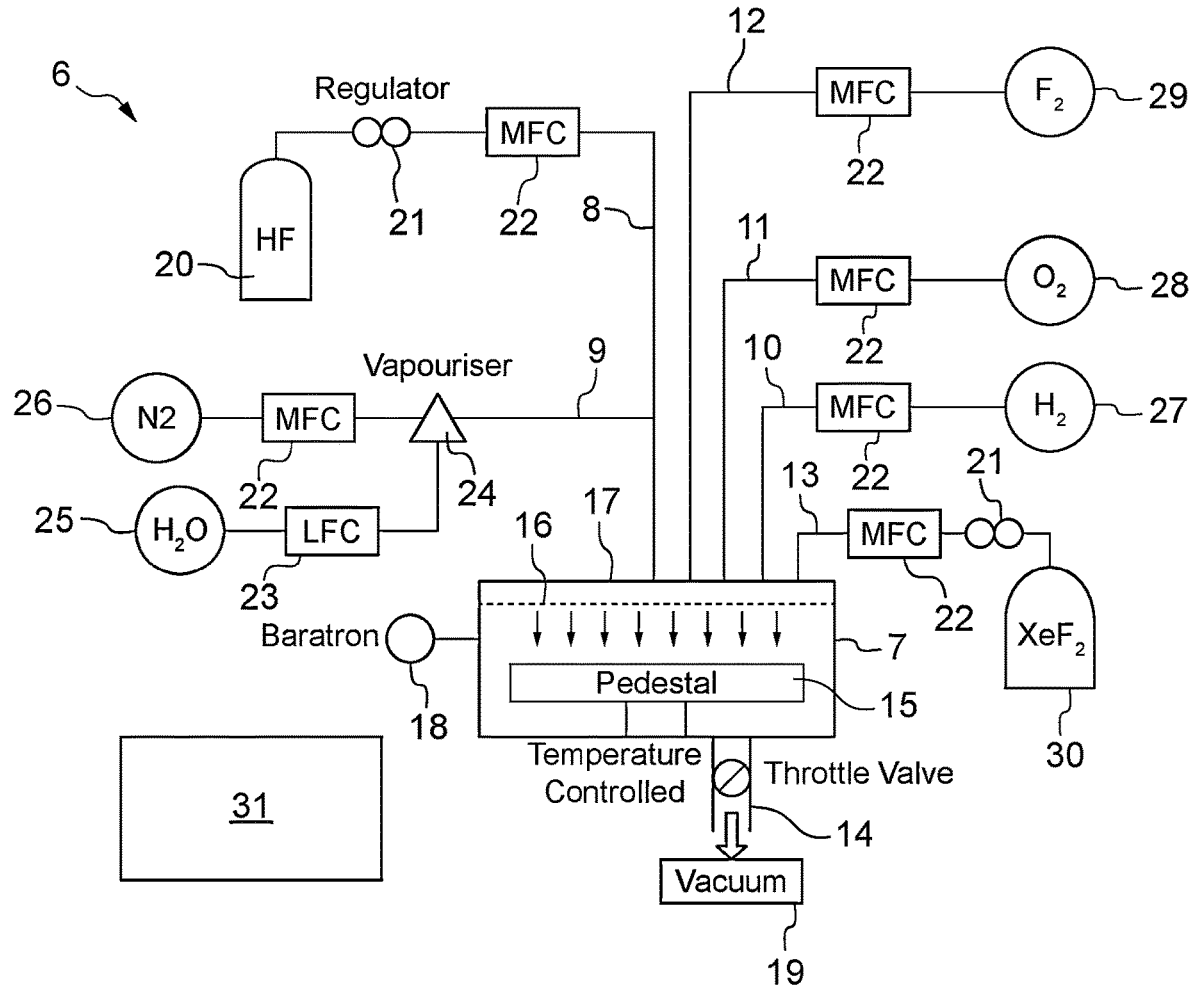
FIG. 2 presents a schematic representation of a process chamber system suitable for carrying out an HF vapour etch of the MEMS of FIG. 1.

FIG. 2 presents a schematic representation of an etching apparatus 6 suitable for etching the MEMS 1 of FIG. 1. The etching apparatus 6 can be seen to comprise an etching chamber 7 attached to which are six input lines 8, 9, 10, 11, 12 and 13, and an output vacuum line 14.

Within the etching chamber 7 is a temperature controlled pedestal 15 suitable for locating the MEMS structure 1 to be etched within the etching chamber 7. Fluids supplied from the six input lines 8, 9, 10, 11, 12 and 13 enter the internal volume of the etching chamber 7 via a fluid injection system 16 located within a lid 17 the etching chamber 7.

The pedestal 15, upon which the MEMS 1 is located, can be set and maintained at a pedestal temperature $T_p$, by a temperature controller. This temperature may be above or below room temperature, the particular temperature being selected to optimise the etching process (typically 5-25° C.). In addition, during the etching process the walls of the etching chamber 7 are heated, typically to around 20-70° C.

The pressure of the etchant gas within the etching chamber, $P_c$, is monitored by a chamber pressure controller 18. The pressure controller 18 also incorporates a gas flow controller employed to provide a means of controlling the pressure within the etching chamber 7 by controlling the operation of a vacuum pumping system 19 located on the output vacuum line 14.

HF vapour 20 is controllably supplied to the etching chamber 7 by the first input line 8 through a regulator 21 and a first mass flow controller (MFC) 22.

Controlled quantities of water are supplied to the etching chamber 7 by the second input line 9. In particular, a liquid fluid controller (LFC) 23 and vaporiser 24 located within the second input line 9 is employed to produce controlled levels of water vapour from a water reservoir 25. A flow of nitrogen from a nitrogen gas source 26 through to the vaporiser 24 is controlled by a second MFC 22. The nitrogen carrier gas is employed to transport water vapour to the internal volume of etching chamber 7 via the fluid injection system 16.

The third 10, fourth 11 and fifth 12 input lines provide means for connecting additional gas sources 27, 28 and 29 e.g. hydrogen ($H_2$), oxygen ($O_2$) or fluorine ($F_2$) to the internal volume of the etching chamber 7. Control of these gas flows is again provided by mass flow controllers (MFC) 22.

Xenon Difluoride ($XeF_2$) vapour 30 is controllably supplied to the etching chamber 7 by the sixth input line 13 through a second regulator 21 and a mass flow controller (MFC) 22.

A computer controller 31 is employed to automate the regulation of the various components and parameters of the etching chamber 7, e.g. the supply of nitrogen carrier gas, HF vapour, chamber temperatures and pressure etc.

In order to allow the described method of etching to proceed it is necessary to obtain a diagnostic that allows for the accurate monitoring of the condensed fluid layer 5. As described above, the physical properties of the condensed fluid layer 5 directly affect the etching rate on the MEMS 1 thus by monitoring the etch rate a direct diagnostic of the physical properties of the condensed fluid layer 5 is obtained.

In practice the etch rate can be monitored in numerous ways, e.g. by monitoring the level of by-products produced, by monitoring the wafer etch directly or by monitoring a change in chamber conditions.

Figure 3:
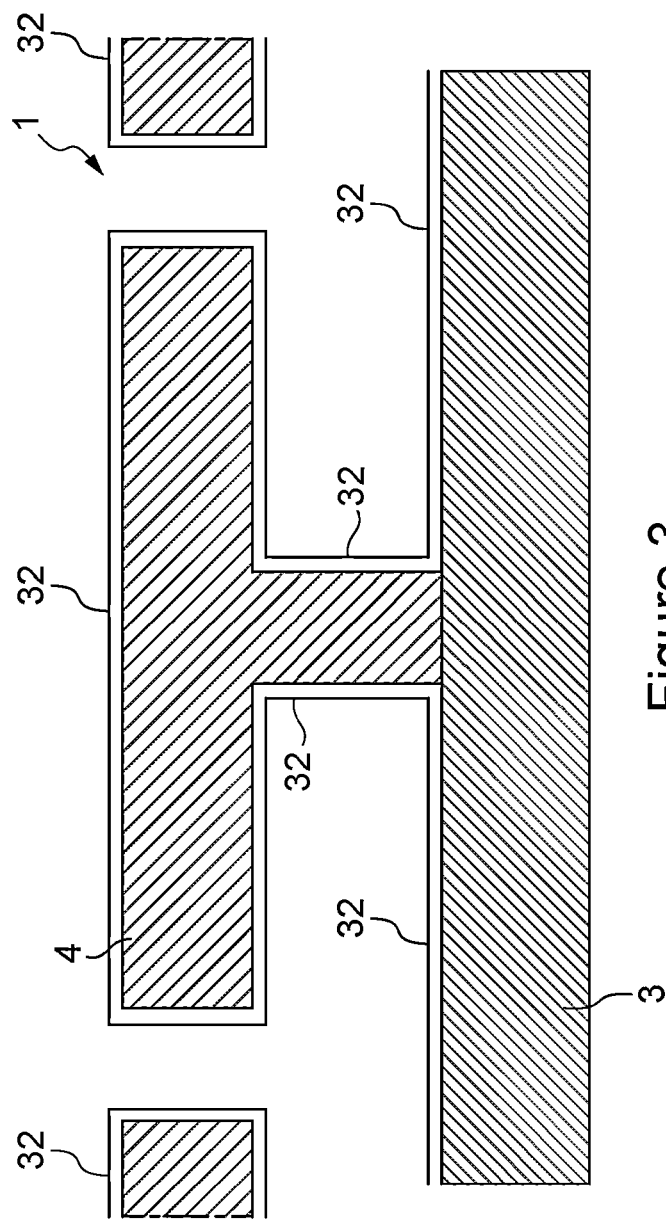
FIG. 3 presents a schematic representation of the MEMS of FIG. 1 following the HF vapour etch process.

FIG. 3 presents a schematic representation of the MEMS 1 of FIG. 1 following the HF vapour etch process carried out within etching apparatus 6 of FIG. 2. As can be seen, once the HF process is complete the silicon dioxide layer 2 is removed such that the release structure 4, typically formed from silicon or aluminium, is free to move relative to the substrate 3 and so operate as required. Unfortunately, a residual layer, represented generally by reference numeral 32, is present on the exposed surfaces of the MEMS 1. The residual layer 32 has the appearance of a random distribution of particle residues.

Of the chemical precursors employed within the previously discussed PECVD processes to deposit the silicon dioxide layer 2 the two most commonly used silicon sources are silane ($SiH_4$) or tetraethyl orthosilicate (TEOS), formally named tetraethoxysilane, ($Si(OC_2H_5)_4$).

When the silicon source is silane ($SiH_4$) the oxygen source is normally nitrous oxide. In this case the applicants have found that nitrogen and can be incorporated into the silicon dioxide layer and so when etched with the HF vapour the residual layer 32 produced comprises an ammonium salt.

When TEOS is employed as the silicon source the applicants have found that subsequent etching of the MEMS 1 with an HF vapour produces a residual layer 32 that comprises a carbon impurity.

The applicants have also found that the residual layer 32 produced during the HF vapour etch of the MEMS 1 often comprises a silicon impurity, irrespective of the silicon source. The presence of the silicon impurity within the residual layer 32 may be the result of the PECVD conditions producing a silicon rich silicon dioxide layer 2. In this case, when the HF vapour etches the silicon dioxide layer 2 it will not etch the silicon contaminant and thus the silicon contaminant remains as a residue. To date, a silicon based residual layer 32 has been completely overlooked in the art since the presence of silicon within any post etching analysis of the MEMS 1 has always been attributed by the skilled man to the fact that silicon is located within other areas of the device e.g. the substrate 3.

Figure 4:
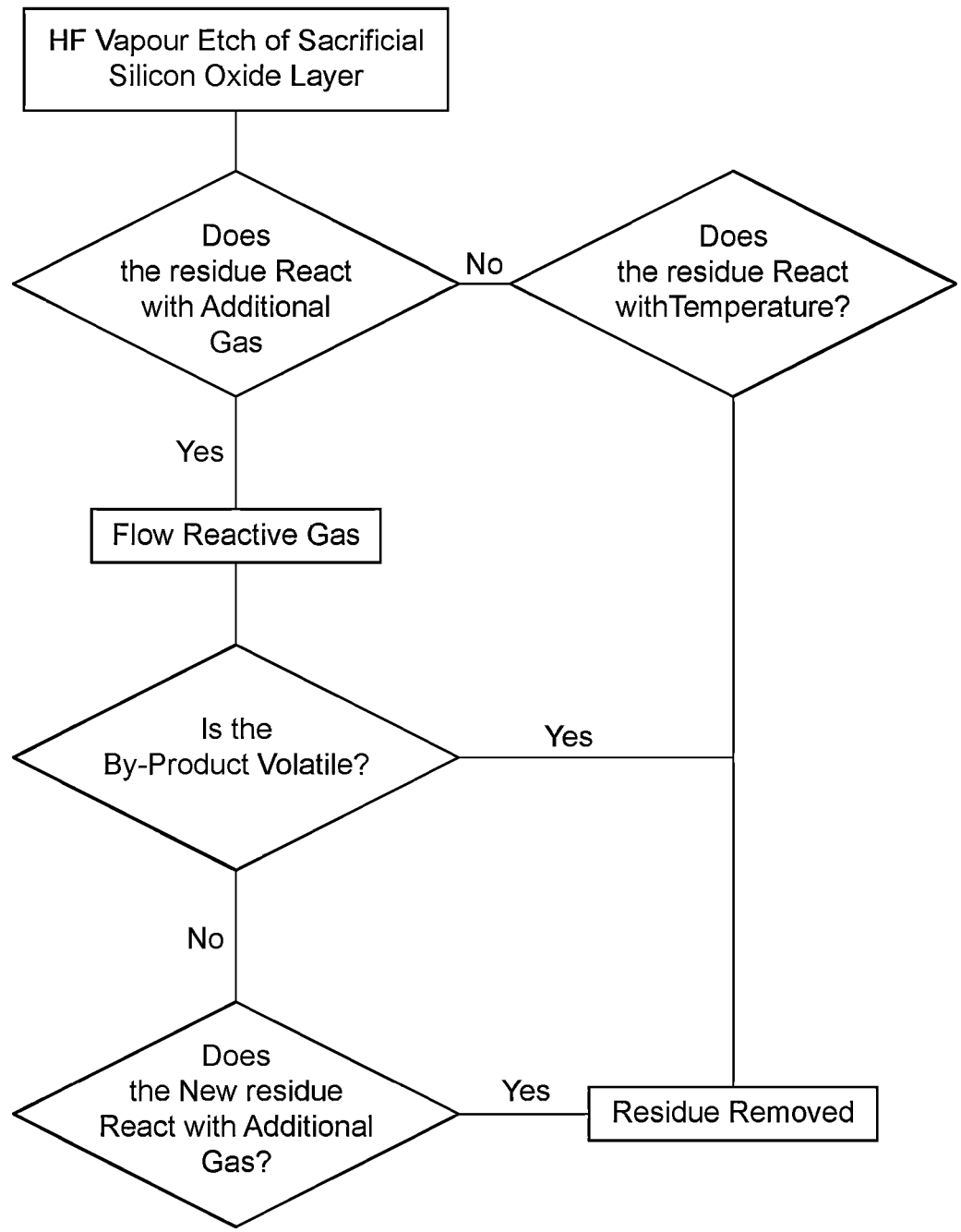
FIG. 4 presents a flow chart of the methodology for producing a MEMS in accordance with the present invention.

Various methods for producing a microstructure e.g. a semiconductor device or a MEMS 1, inclusive of removing a residual layer 32, in accordance with the present invention will now be described with reference to FIG. 4.

The process involves the HF vapour etching of a sacrificial silicon dioxide layer 2, as described in detail above with respect to FIGS. 1 to 3. The process then involves removing the residual layer 32 from the microstructure by employing one or more of the following techniques.

When the residual layer 32 comprises silicon the third input line 10 may be employed to connect the hydrogen gas source 27 to the etching chamber 7. The hydrogen gas may be ionised, for example by a remote plasma system, before being supplied to the etching chamber 7. Alternatively, the hydrogen gas may be ionised within the etching chamber 7 itself. The silicon within the residual layer 32 then reacts with the hydrogen to produce silane ($SiH_4$). As silane ($SiH_4$) is a volatile substance it can simply be pumped out of the etching chamber 7 by the vacuum pumping system 19.

Alternatively, the fourth input line 11 may be employed to connect the oxygen gas source 28 to the etching chamber 7. The oxygen gas may be ionised, for example by a remote plasma system, before being supplied to the etching chamber 7. Alternatively, the oxygen gas may be ionised within the etching chamber 7 itself. The silicon within the residual layer 32 then reacts with the oxygen to produce silicon dioxide ($SiO_2$). The above described HF vapour etching process can then be repeated in order to remove the residual layer 32 in a similar manner to that describes with respect to the sacrificial silicon dioxide layer 2. The by-products of this second HF vapour etching process can again simply be pumped out of the etching chamber 7 by the vacuum pumping system 19.

When the residual layer 32 comprises silicon the fifth input line 12 may be employed to connect the fluorine gas source 29 to the etching chamber 7. The fluorine gas may be ionised, for example by a remote plasma system, before being supplied to the etching chamber 7. Alternatively, the fluorine gas may be ionised within the etching chamber 7 itself. The silicon within the residual layer 32 then reacts with the fluorine to produce silicon tetrafluoride ($SiF_4$). As silicon tetrafluoride ($SiF_4$) is a volatile substance it can simply be pumped out of the etching chamber 7 by the vacuum pumping system 19.

A fourth technique that can be employed to remove the residual layer 32 when it comprises silicon is to carry out a Xenon Difluoride ($XeF_2$) vapour etching process within the etching chamber 7. Here the sixth input line 13 is employed to connect the Xenon Difluoride ($XeF_2$) vapour 30 to the etching chamber 7. The applicants own European patent numbers EP 1,766,665 B1 and EP 2,480,493 B1 both disclose techniques for etching silicon with Xenon Difluoride ($XeF_2$) vapour which can be carried out by adapting the etching apparatus 6 of FIG. 2.

It will be recognised that the above described methods for removing the residual layer 32 when it comprises silicon can be problematic as there are normally other exposed areas of silicon material that forms the operating MEMS 1 or semiconductor device. Therefore any of the above described techniques for removal of the residual layer 32 would be expected to also remove silicon within these surrounding areas. However, the applicants have discovered that the rate of etching of the residual layer 32 when it comprises silicon is generally much higher than for any silicon found within surrounding areas of the device. As a result, the above techniques can be carried out before any significant etching of the surrounding silicon areas takes place. The applicants believe that the reason for these significant differences in silicon etch rates is due to the fact that the silicon within the exposed residual layer 32 is not a well-structured solid but instead comprises a very amorphous porous structure.

When the residual layer 32 comprises carbon the fourth input line 11 may be employed to connect the oxygen gas source 28 to the etching chamber 7. The oxygen gas may again be ionised, for example by a remote plasma system, before being supplied to the etching chamber 7. The carbon within the residual layer 32 then reacts with the oxygen to produce carbon dioxide ($CO_2$) and or carbon monoxide (CO). As carbon dioxide ($CO_2$) and carbon monoxide (CO) are both volatile substances they can both simply be pumped out of the etching chamber 7 by the vacuum pumping system 19.

Alternatively, when the residual layer 32 comprises carbon the third input line 10 may be employed to provide a hydrogen gas supply to the etching chamber 7. The hydrogen gas may be ionised, for example by a remote plasma system, before being supplied to the etching chamber 7. Alternatively, the hydrogen gas may be ionised within the etching chamber 7 itself. The carbon within the residual layer 32 then reacts with the hydrogen to produce methane ($CH_4$). As methane ($CH_4$) is a volatile substance it can simply be pumped out of the etching chamber 7 by the vacuum pumping system 19.

Alternatively, when the residual layer 32 comprises carbon the fifth input line 12 may be employed to provide a fluorine gas supply to the etching chamber 7. The fluorine gas may be ionised, for example by a remote plasma system, before being supplied to the etching chamber 7. Alternatively, the fluorine gas may be ionised within the etching chamber 7 itself. The carbon within the residual layer 32 then reacts with the fluorine to produce tetrafluoride ($CF_4$) and or Hexafluoroethane ($C_2F_6$). As tetrafluoride ($CF_4$) and Hexafluoroethane ($C_2F_6$). are both volatile substances they can simply be pumped out of the etching chamber 7 by the vacuum pumping system 19.

When the residual layer 32 comprises ammonium salt, an alternative technique is required to be employed. As ammonium salt is known to decompose at temperatures >160° C. the applicants realised that by employing the heating elements within the etching chamber 7 to heat the MEMS 1 then the ammonium salt can be caused to evaporate and thereafter pumped out of the etching chamber 7 by the vacuum pumping system 19.

The above described methods of forming a MEMS have the significant advantage over those systems known in the art that employ an HF vapour etch step to remove a silicon dioxide ($SiO_2$) sacrificial layer in that they provide a means for reduction or removal of residual layers formed as a by-product of this process. Most significantly, the above described methods provide a means for the removal of previously unrecognised silicon based residual layers.

Although the above described techniques have been described specifically with reference to MEMS the above techniques apply to alternative microstructures (e.g. semiconductor devices) the production of which employs an HF vapour etch step to remove a silicon dioxide ($SiO_2$) sacrificial layer.

In the above discussion, the removal of residual layers comprising silicon, carbon and ammonium salt have been independently described above. However, it will be appreciated by the skilled reader that two or more of these impurities may be present within a single silicon dioxide ($SiO_2$) sacrificial layer. The above described techniques may therefore be applied concurrently, or sequentially, to a microstructure in order to remove such complex residual layers formed thereon when an HF vapour is employed to etch a silicon dioxide ($SiO_2$) sacrificial layer. Furthermore, one or more of the above described techniques may be applied concurrently with the vapour etching of the microstructure.

The above described HF vapour etching, and the removal of residual layer, have also been described as taking place within a common process chamber. It will be further appreciated by the skilled reader that an alternative embodiment would be to transfer the microstructures from a first process chamber, within which the HF vapour etch is preformed, to a second processing chamber in order to perform one or more of the above described techniques for the removal of the residual layer.

There is provided a method of producing a microstructure that comprises employing a hydrogen fluoride (HF) vapour to etch a sacrificial layer of silicon dioxide ($SiO_2$) and thereafter removing a residual layer formed when HF vapour etching the layer of silicon dioxide. The residual layer may comprise silicon, ammonium salt or carbon and various techniques are disclosed for removing such layers. These techniques may be applied concurrently, or sequentially, to the microstructure. The described methodologies therefore produce microstructures that exhibits reduced levels of residue when as compared to those techniques known in the art.

The foregoing description of the invention has been presented for the purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A method of manufacturing a microstructure the method comprising:
    employing a hydrogen fluoride (HF) vapour to etch a sacrificial layer of silicon dioxide ($SiO_2$); and
    once the HF vapour etch is complete, subsequently removing a solid silicon residue formed when HF vapour etching the layer of silicon dioxide,
    wherein removing the solid silicon residue comprises:
    reacting the silicon with a hydrogen gas to produce silane ($SiH_4$); or
    reacting the silicon with a fluorine gas to produce silicon tetrafluoride ($SiF_4$); or
    etching the silicon with a Xenon Difluoride ($XeF_2$) vapour.

2. A method of manufacturing a microstructure as claimed in claim 1 wherein the vapour etching of the sacrificial layer of silicon dioxide ($SiO_2$) and the removal of the solid silicon residue are performed sequentially within a common processing chamber.

3. A method of manufacturing a microstructure as claimed in claim 1 wherein the vapour etching of the sacrificial layer of silicon dioxide ($SiO_2$) and the removal of the solid silicon residue are performed sequentially within separate processing chambers.

4. A method of manufacturing a microstructure as claimed in claim 1 wherein the method further comprises employing a vacuum pumping system to remove by products formed when removing the solid silicon residue.

5. A method of manufacturing a microstructure as claimed in claim 1 wherein the microstructure comprises a micro electromechanical systems (MEMS).

6. A method of manufacturing a microstructure as claimed in claim 1 wherein the microstructure comprises a semiconductor device.

\* \* \* \* \*